(12) United States Patent
Parkinson

(10) Patent No.: US 8,077,498 B2
(45) Date of Patent: *Dec. 13, 2011

(54) READING A PHASE CHANGE MEMORY

(75) Inventor: Ward D. Parkinson, Boise, ID (US)

(73) Assignee: Ovonyx, Inc., Troy, MI (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/939,218

(22) Filed: Nov. 4, 2010

(65) Prior Publication Data
US 2011/0103141 A1 May 5, 2011

Related U.S. Application Data

(62) Division of application No. 12/283,560, filed on Sep. 11, 2008, now Pat. No. 7,849,712, which is a division of application No. 11/093,710, filed on Mar. 30, 2005, now Pat. No. 7,453,715.

(51) Int. Cl.
G11C 11/00 (2006.01)
(52) U.S. Cl. ....................................... 365/148
(58) Field of Classification Search .................. 365/148
See application file for complete search history.

(56) References Cited

U.S. PATENT DOCUMENTS
2006/0146600 A1* 7/2006 Johnson ........................ 365/163
* cited by examiner Primary Examiner — Hoai V Ho
Assistant Examiner — Anthan Tran
(74) Attorney, Agent, or Firm — Trop, Pruner & Hu, P.C.

(57) ABSTRACT

A phase change memory cell may be read by driving a current through the cell higher than its threshold current. A voltage derived from the selected column may be utilized to read a selected bit of a phase change memory. The read window or margin may be improved in some embodiments. A refresh cycle may be included at periodic intervals.

7 Claims, 5 Drawing Sheets

Note: Repeat if write current pulse used

US 8,077,498 B2

READING A PHASE CHANGE MEMORY

CROSS-REFERENCE TO RELATED APPLICATION

This application is a divisional of U.S. patent application Ser. No. 12/283,560, filed on Sep. 11, 2008 now U.S. Pat. No. 7,849,712, which is a divisional of U.S. patent application Ser. No. 11/093,710, filed on Mar. 30, 2005, which issued as U.S. Pat. No. 7,453,715.

BACKGROUND

This invention relates generally to semiconductor memories.

Phase change memory devices use phase change materials, i.e., materials that may be electrically switched between a generally amorphous and a generally crystalline state, as an electronic memory. One type of memory element utilizes a phase change material that may be, in one application, electrically switched between generally amorphous and generally crystalline local orders or between different detectable states of local order across the entire spectrum between completely amorphous and completely crystalline states.

Typical materials suitable for such an application include various chalcogenide elements. The state of the phase change materials is also non-volatile. When the memory is set in either a crystalline, semi-crystalline, amorphous, or semi-amorphous state representing a resistance value, that state is retained until reprogrammed, even if power is removed. This is because the programmed resistance represents a phase or physical state of the material (e.g., crystalline or amorphous).

Conventionally, phase change memories are read without triggering the memory element. Triggering occurs when the threshold current (at threshold voltage) of the memory element is exceeded. As a result, the read current may be limited to avoid triggering. But limiting the read current reduces performance.

Thus, it would be desirable to improve the performance of phase change memories.

DETAILED DESCRIPTION

Figure 1:
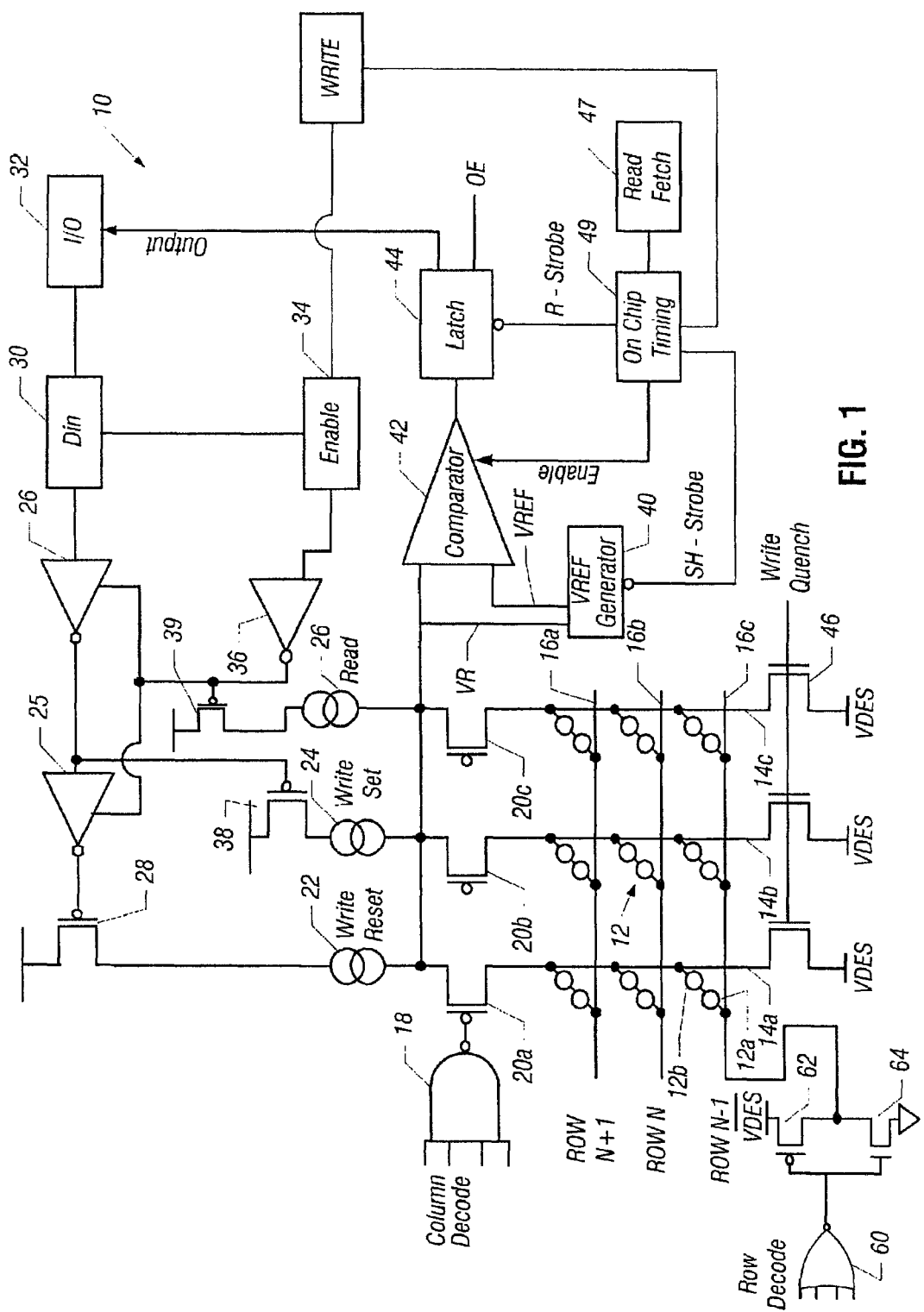
FIG. 1 is a circuit diagram for one embodiment of the present invention.

Referring to FIG. 1, a memory 10 may include an array of memory cells 12 arranged in rows 16 and columns 14 in accordance with one embodiment of the present invention. While a relatively small array is illustrated, the present invention is in no way limited to any particular size of an array. While the terms "rows" and "columns" are used herein, they are merely meant to be illustrative and are not limiting with respect to the type and style of the sensed array.

The cell 12 may be any memory cell including a phase change memory cell. Examples of phase change memory cells include those using a chalcogenide memory element 12b and threshold device 12a. One select or threshold device is an ovonic threshold switch that can be made of a chalcogenide alloy that does not exhibit an amorphous to crystalline phase change and which undergoes rapid, electric field initiated change in conductivity that persists so long as a holding current is present.

In the case illustrated, a cell 12 includes an access, select, or threshold device 12a, as well as a sensing device 12b which actually stores a bit of data. A set of transistors 46 may be located on the columns 14 in order to enable write quenching and deselecting, and precharging to a voltage, which may be different than the deselect voltage $V_{DES}$ by multiplexing to a different voltage.

A column decoder 18 receives address signals to select the desired column 14 using transistors 20 associated with each column. A reset write current source 22, a set write current source 24, and a read current source 26 are coupled at a common node at their outputs to supply current to the selected column 14, such as the column 14b as determined by which column transistor 20 is on. Of course, the current sources in actual practice would be coupled to selected columns as needed in response to commands from an external memory user such as a processor (not shown), at the address provided by the external user.

A row decoder 60 receives address signals to select the desired row. The output of the decoder 60 passes through an inverter made up of transistors 62 and 64 to the selected row 16.

Transistors 28, 38 and 39 are on/off switches that provide the desired current generated by the current sources 22, 24 or 26, to the selected column 14. A NOR gate enable circuit 36 with an input from Enable 34 provides a control circuit for the transistor 39 and thus for the read current source 26 and also may provide an enable signal for Din gates 25 and 26 to enable one of the two gates for writing to the user selected state. The gates 25 and 26 are gated on by an enable circuit 36 and receive a Din 30 signal as another input to select which write current source is activated. An input/output (I/O) control 32 is coupled to the Din circuit 30. Enable 34 is controlled by the write input to the chip. Write input or read fetch 47 requests a read cycle from the on-chip timing block 49, which starts the on-chip timing and sequentially enables the comparator 42 and latches the data for the I/O 32 for a read, or enables Din gate 25 and 26 (and disable gate 36) if a write and produces a current pulse of appropriate amplitude to write a reset and less amplitude to write a set bit. Alternatively, the current amplitude of both reset and set bits may be adequate for reset, with the bit written to reset if the trailing edge is fast (e.g. less than 10 nsec) or slow (e.g. greater than 100 nsec.) if the set state is desired.

For reading, a comparator 42 is enabled by the on-chip timing 49 (in response to a read fetch request 47) and receives one input from a selected column (e.g. column 14c) being read. The comparator 42 and reference voltage generator 40 may be provided on each column 14 in one embodiment, but as shown, the generator 40 may be shared across an array or block of row or column lines to reduce comparator 42 related layout area.

The reference voltage generator 40 receives a voltage VR from the column 14 and outputs a voltage VREF to the comparator 42. The reference generator 40 is strobed by a sample and hold (SH) strobe from the on-chip timing block 49. The output from the comparator 42 to a data output latch 44 provides an output enable (OE) signal as an option which at least indicates when the output can be driven (ready/busy), though usually OE is furnished by a separate external processor to enable the output driver. The output signal from the latch 44 is controlled by a read (R) strobe from the on-chip timing block 49.

The set state corresponds to a lower resistance value and the reset state corresponds to a higher resistance value in the memory element 12b. Thus, the reference voltage level is between the reset and set levels, at the instance of time when read data is latched.

Figure 3:
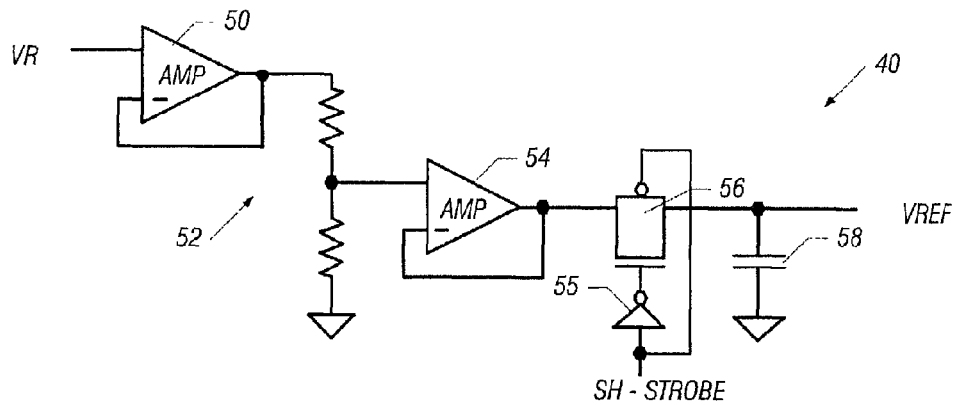
FIG. 3 is a circuit diagram for the voltage reference generator shown in FIG. 1 in accordance with one embodiment of the present invention.

Referring to FIG. 3, the generator 40 receives a reference signal voltage VR from the selected column 14. That voltage is buffered by a first amplifier 50 and a second amplifier 54. The amplifier 54 receives its voltage from voltage divider 52. While a resistor divider is shown, other voltage dividers may be used including a capacitor divider for reduced power and better layout efficiency. The voltage divider 52 may provide a 0.25 volt offset from the actual column voltage in one embodiment.

A pass transistor 56 is controlled by the sample and hold (SH) strobe signal. The transistors 56 conduct when the sample and hold. (SH) signal turns on the transistors. The SH strobe signal determines when to latch the reference voltage level, by turning off the transistors 56. The signal from the pass transistor 56 may then be stored for subsequent comparison for a period of time in a capacitor 58. In one embodiment, the capacitor 58 may be 0.001 microfarads, storing the reference voltage signal for about 200 nanoseconds for example or whatever time is necessary to allow the column to change for further comparison to this stored level. This same function can also be done by a more sophisticated sample and hold.

In one embodiment, the phase change material used in the sensing device 12b may be suitable for non-volatile memory data storage. The phase change material may be a material having electrical properties (e.g., resistance) that may be changed through the application of energy such as, for example, heat, light, voltage potential, or electrical current.

Examples of phase change materials may include a chalcogenide material. A chalcogenide material may be a material that includes at least one element from column VI of the periodic table or may be a material that includes one or more of the chalcogen elements, e.g., any of the elements of tellurium, sulfur, or selenium. Chalcogenide materials may be non-volatile memory materials that may be used to store information that is retained even after electrical power is removed.

In one embodiment, the phase change material may be chalcogenide element composition from the class of tellurium-germanium-antimony ($Te_xGe_ySb_z$) material or a GeSbTe alloy, such as type 2,2,5 although the scope of the present invention is not limited to just these materials.

In one embodiment, if the memory material is a non-volatile, phase change material, the memory material may be programmed into one of at least two memory states by applying an electrical signal to the memory material. An electrical signal may alter the phase of the memory material between a substantially crystalline state and a substantially amorphous state, wherein the electrical resistance of the memory material in the substantially amorphous state is greater than the resistance of the memory material in the substantially crystalline state.

Programming of the memory material to alter the state or phase of the material may be accomplished by selecting the cell through applying a relatively low voltage, such as zero volts to the line 16 and a current into the selected column 14, from current source 22 (to reset to a higher resistance) or 24 (a lower current or slower trailing edge to reset to a lower resistance) thereby generating a voltage potential across the memory material. An electrical current may flow through a portion of the memory material in response to the applied voltage potentials, and may result in heating of the memory material.

This controlled heating and subsequent controlled cooling may alter the memory state or phase of the memory material. Altering the phase or state of the memory material may alter an electrical characteristic of the memory material. For example, resistance of the material may be altered by altering the phase of the memory material. Either all or a portion of the phase change memory material may be altered during the writing pulse (i.e. only a portion/region of sensing device 12b adjacent to either the top or bottom electrode may be phase changed during the write operation). In one embodiment, primarily the portion of memory material that undergoes phase change is the region that is adjacent to the smaller electrode contacting the memory element 12b. The memory material may also be referred to as a programmable resistive material or simply a programmable resistance material or memory.

In one embodiment, a voltage pulse with a potential difference of about 1.5 volts may be applied across portion of the memory material by applying about 0 volts to a line 16 and a current of about 2 ma from write current source 22 into the selected line 14. For example, the voltage on the selected line 14 is positive relative to the selected line 16, but the cell or voltages may also be reversed. A current flowing through the memory material in response to the applied voltage potentials may result in heating of the memory material. This heating and subsequent controlled cooling, determined by the write current pulse trailing edge rate, may alter the memory state or phase of the material after it is cooled, from higher to lower resistance or lower to higher resistance, or simply to rewrite the existing state to reinforce it.

In a "reset" state, the memory material may be in an amorphous or semi-amorphous state and in a "set" state, the memory material may be in a crystalline or semi-crystalline state. The resistance of the memory material in the amorphous or semi-amorphous state may be greater than the resistance of the material in the crystalline or semi-crystalline state. The association of reset and set with amorphous and crystalline states, respectively, is a convention. Other conventions may be adopted.

Due to electrical current, the memory material may be heated to a relatively higher temperature and then subsequently cooled at a fast rate (for example, less than 10 nsec, edge decay of voltages on the column in terminating the write current) to amorphisize memory material and "reset" memory material. Heating the volume or memory material to a relatively lower crystallization temperature or reducing the temperature slowly (e.g. edge rage greater than 100 nsec.) may crystallize using reduced current and "set" the memory material to a lower resistance state. Various resistances of memory material may be achieved to store information by varying the amount of current flow and duration through the volume of memory material, or by tailoring the edge rate of the trailing edge of the programming current or voltage pulse (that may control the cooling rate of the selected memory element). These techniques may use feedback by reading the cell and then rewriting it to adjust, thus tailoring the memory cell more precisely to a desired resistance, and thus allowing storing and sensing more than two levels in the cells for more efficient data or analog storage.

The information stored in memory material may be read by measuring the resistance of the memory material. As an example, a read current may be provided to the memory material using the selected row and column and a resulting read voltage across the memory material may be compared against a reference voltage using, for example, the sense amplifier 42. The resulting read voltage on the column may be proportional to the resistance exhibited by the selected memory storage device 12b when a read current is forced into the column.

Figure 2A:
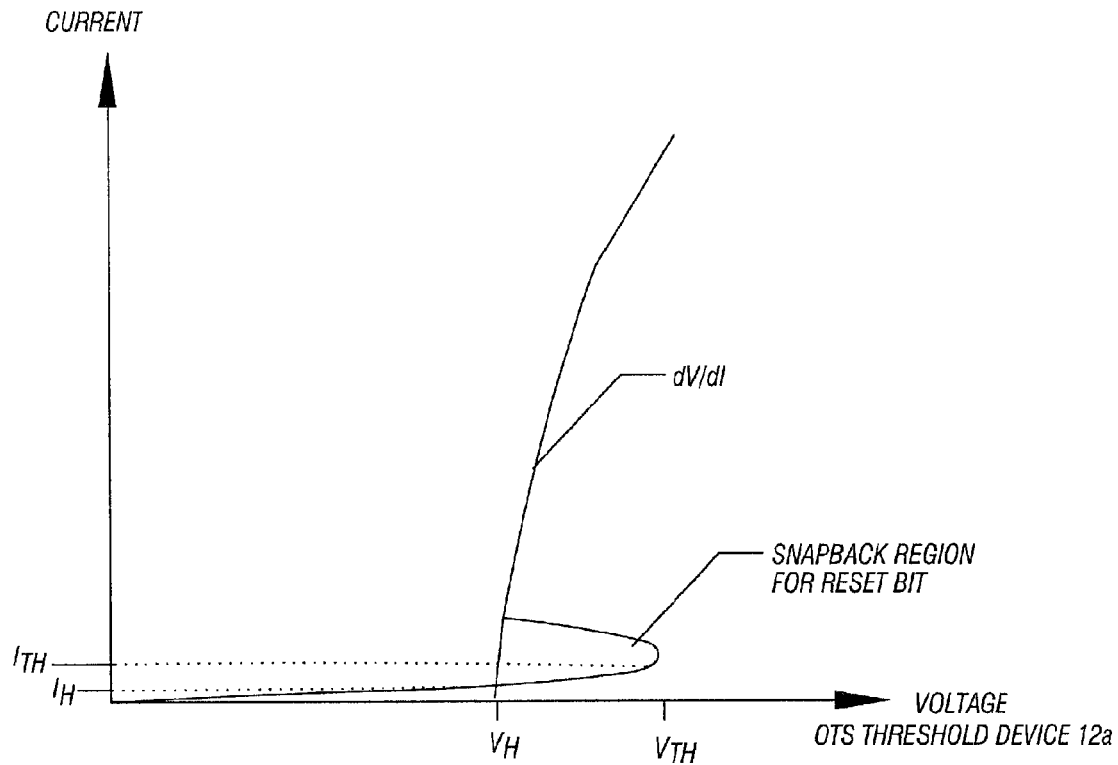
FIG. 2A is a hypothetical, representative current-voltage curve for a threshold device.

In a low voltage or low field regime "L" in FIG. 2A, the device 12a is off and may exhibit very high resistance in some embodiments. The off resistance can, for example, range from preferably greater than 50,000 ohms to be greater than 10 gigaohms at a bias of about half the threshold voltage. The device 12a may remain in its off state until a voltage across it exceeds a threshold voltage ($V_{TH}$) or until a current exceeding a threshold current ($I_{TH}$) switches the device 12a to a highly conductive, low or dynamic resistance "on" state called dV/dI region that, when extrapolated, will intercept the X axis at the holding voltage $V_H$(ots), as indicated in FIG. 2A. After turn-on, the voltage across the device 12a drops to a lower voltage, called the holding voltage $V_H$, and remains very close to this holding voltage almost regardless of the column current since the dynamic on resistance is relatively low, frequently less than 1000 ohms (in series with the threshold device 12a holding voltage). In one embodiment of the present invention, as an example, the threshold voltage may be on the order of 3.1 volts and the holding voltage may be on the order of 2.9 volts. This relatively high holding voltage that is near the threshold voltage may be achieved by using three OTS devices in series as select device 12a, each with a threshold voltage of 1V, about equal to its holding voltage. Alternatively, a higher $V_{TH}$, lower leakage select device 12a may be used in series with a lower $V_{TH}$ select device 12a, having higher leakage. The combined select device may have a reduced difference between $V_{TH}$ and $V_H$ to better assure that the snapback does not force excessive current (Isafe) though the memory element 12b that will increase its resistance during reading. In one embodiment, the Vthots may be increased to be greater than Vhots by more than Vthoum. Then, when the ots thresholds, the snapback voltage difference from Vth to Vh will exceed Vthoum. Hence, when the ots selects a reset bit, the reset bit will also threshold when the ots thresholds. By allowing Vsnap to exceed Vthoum, a single device with lower leakage may be used. For example, Vthots may be 3V and Vhots 1V, even if the Vthoum is 1V or less.

After passing through the snapback region, in the on state, the device 12a voltage drop remains close to the holding voltage as the current passing through the device is increased, even if at a relatively high, read or write current level. Above a relatively high current level (density) the device remains on but displays a finite and increasing dynamic resistance, with the voltage drop across 12a increasing with increasing current due to the IR drop across the dynamic resistance.

The device 12a may remain on until the current through the device 12a is reduced below a characteristic holding current value that is dependent on the type and area of the material, and may be impacted by the top and bottom electrodes utilized to form the device 12a, as well as the magnitude of capacitance on the column line.

In some embodiments of the present invention, the threshold device 12a does not change phase. It remains permanently amorphous and its current-voltage characteristics may remain the same throughout its operating life.

As an example, for a 0.5 micrometer diameter device 12a, with a thickness of approximately 750 Angstroms, formed of TeAsGeSSe having respective atomic percents of 16/13/15/1/55, the holding current may be on the order of 0.1 to 1 micro-amps (uA) in one embodiment. Below this holding current, the device 12a turns off and returns to the high resistance regime at low voltage, low field L in FIG. 2A. The threshold current for the device 12a may generally be of the same order as the holding current, or preferably greater to avoid oscillation if driven by a high impedance current source. The holding current may be altered by changing process variables, such as the top and bottom electrode material and the chalcogenide material. The device 12a may provide high "on current" for a given area of device compared to conventional access devices such as metal oxide semiconductor field effect transistors or bipolar junction transistors or semiconductor diodes. However, such other select devices may also be used in some embodiments.

Figure 2B:
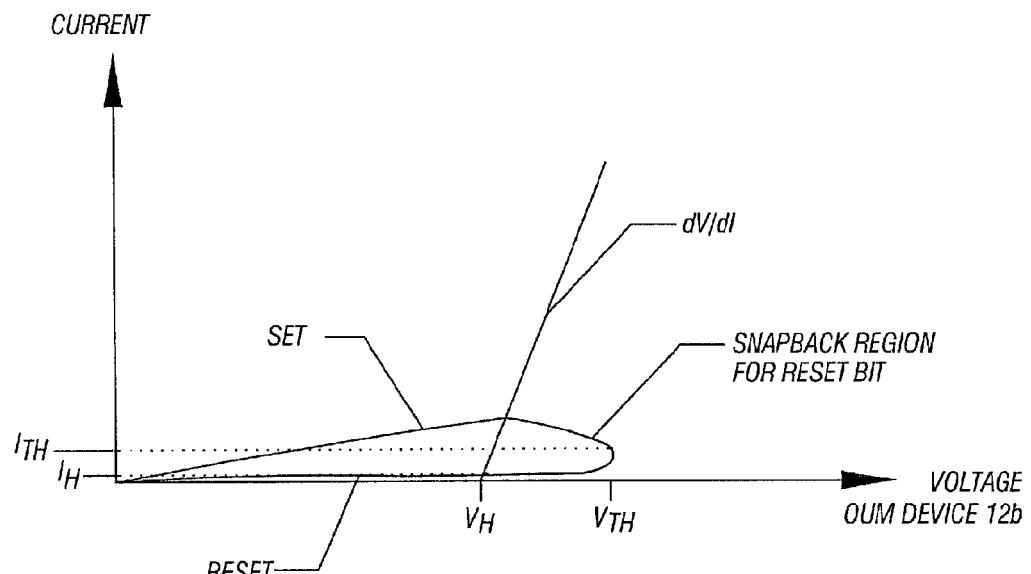
FIG. 2B is a hypothetical, representative current-voltage curve for a memory element.

As shown in FIG. 2B, the set bit is relatively low resistance beginning at the origin and sloping up to intercept the snap-back of the reset bit, where the dynamic resistance tends to be lower for increasing current. Reducing the current will retrace the origin if the bit is set. If the bit is reset, as the current is reduced the voltage is reduced until less than $I_H$(oum), where the voltage then increases along the lower curve towards $V_{TH}$ (oum).

Figure 4A:
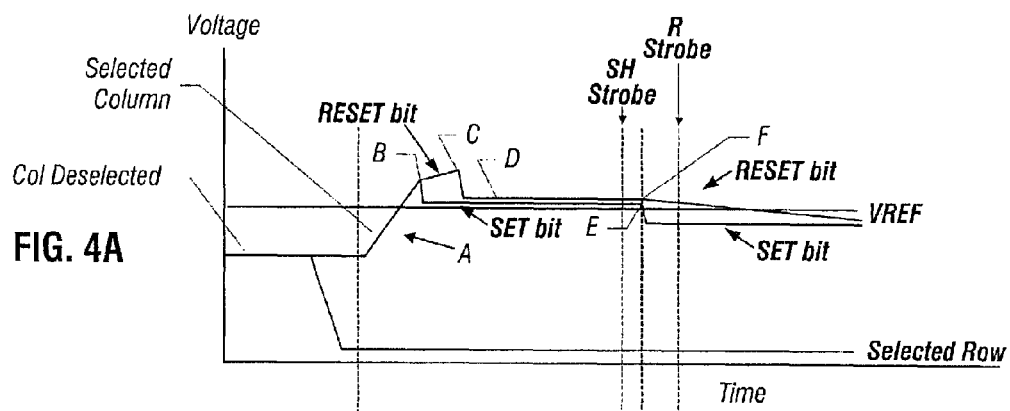
FIG. 4A is a plot of voltage versus time for a selected column in accordance with one embodiment of the present invention.

Referring to FIG. 4A, the column voltage level over time is shown for a selected column 14c and row in accordance with one hypothetical embodiment. In standby or when deselected, the column and row voltages may approximately equal to V/2, where V is related to the threshold voltages of the devices 12a and 12b and may be adjusted die to die. For improved voltage margin at the expense of leakage, the column deselect may be V/3 and the row deselect 2V/3. For example, V may be 4V if the threshold voltage of the device 12a is typically 3V with $V_H$ of 1V, and if the threshold voltage of the device 12b is typically 1V with a $V_H$ of 0.5V.

Figure 4B:
FIG. 4B is the column current for the selected column versus time in accordance with one embodiment of the present invention.
Figure 4C:
FIG. 4C is a plot of the sample and hold strobe voltage versus time in accordance with one embodiment of the present invention.

While the selected column voltage goes high, the selected row voltage goes low (unless the select device is an N-channel transistor, where the row line goes high for select). The selected row 16 has an initially high voltage which falls, to a steady low voltage as indicated. The deselected column 14 has a relatively low voltage which increases as the column is selected. The column selection is indicated in FIG. 4B where it is shown how the selected column current steps up, causing the selected column voltage to rise after the column is selected. The read column current is above the threshold currents of the threshold device 12a and memory element 12b.

The selected column line 14c is first charged from a deselected voltage to a voltage forced by a read current through the bit that starts at time t, in FIG. 4B. The read current (e.g., 70 microAmps) is greater than the threshold current of the memory element 12b so selected column charging is achieved relatively quickly with this relatively higher read current. Better speed may be achieved in some embodiments with even higher currents since the column voltage charging rate is proportional to the current (dV/dT=I/C).

The column voltage first peaks at B when the select device 12a triggers from $V_{TH}$ to $V_H$. If the bit is set, the voltage may drop back to a lower voltage due to the relatively lower resistance of a set bit. If the bit is reset, the voltage may initially decrease, but will continue to increase thereafter from B to D, when the reset memory element 12b triggers to a lower holding voltage. If the difference between $V_{TH}$ and $V_H$ of the selected device 12a is greater than $V_{TH}$ of the memory element 12b then both the select device 12a and reset memory element 129 will trigger at B.

The resulting voltage VR is sampled at time $t_2$ in the dV/dI region of both the select device 12a and memory element 12b (indicated in FIGS. 2A and 2B) and after the column is near its final voltage, Vfinal ($V_H$(ots)+$V_H$(oum)×Tread×((Rdyn(ots)+Rdyn(oum)), so it will be a similar voltage almost regardless of the memory element 12b bit state (high or low resistance stored in the memory cell 12). The dV/dI region is a low impedance region reached after passing through the snapback region of both elements 12a and 12b. By forcing a read current greater than the $I_{TH}$ of each device 12a and 12b, both are forced into their respective dV/dI regions.

After the column approaches Vfinal, this resulting column voltage is sampled at t2, reduced by an offset voltage (such as 0.25V), and then this voltage is held as a reference voltage by the reference voltage generator 40 for input to the comparator 42. After it is latched at 52, this voltage VREF is held until after t4 for comparison to the column voltage as indicated in FIG. 40.

Figure 4D:
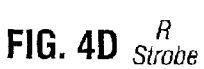
FIG. 4D is a depiction of the R strobe that latches the cell state or read strobe voltage versus time in accordance with one embodiment of the present invention.

After the column voltage is sampled and held, the read current into the column is reduced at time $t_3$, after $t_2$. This starts the period of time for comparing the declining column voltage with the reference voltage (VREF) after the time $t_3$ when the column current is reduced. Once the current is reduced, the resulting column voltage after a period of time ($t_4-t_3$) is compared to the reference voltage by the comparator 42 as a relatively more positive or negative voltage, with the result latched by strobing the data at time $t_4$ as shown in FIG. 4D.

The reference voltage (VR) may be taken from the column, in another embodiment, where the row voltage is not pulled all the way to ground (to minimize the effect of row leakage to deselect columns and ground drop), or relative to change in voltage voltage where the row voltage goes high when selected (because the cell select device 12a is an N-channel transistor, for example). By sampling the voltage at t2, the effect of variations in ground voltage, row voltage, and holding voltages of the ots and oum are minimized Other variations are also possible.

With a read current that is greater than the threshold current ($I_{TS}$ in FIG. 2B) of element 12b, usually the device 12a may trigger (see point B in FIG. 4A) before the element 12b (see point C in FIG. 4A) because the selected device's threshold current may be less than the memory element's threshold current in some embodiments. If the bit is set (low resistance), the RC time constant on the column after the device 12a triggers is low because the set resistance is low. If the element 12b is in the high resistance state, the column continues to charge fast since the final voltage is much greater than the sum of holding voltage of the device 12a and the threshold voltage of the device 12b, until device 12b triggers. The dynamic resistance of the oum is still high until the memory element 12b triggers so the final voltage towards which the column charges until the memory element triggers is still very high after the select device 12a triggers. However, if Vsnap(ots) is greater than Vh(oum), then the device 12b will threshold and the voltage reached by both the set and reset bit will be about the same (if Iread×Rset is about equal to Vhoum). Then, in FIG. 4A, the Reset waveform will be about the same as a set waveform until t3.

Once the bit is accessed after the device 12a triggers, a set bit is in a low resistance state and the column reaches its final voltage (Vfinal) quickly due to its low RC time constant. For a higher resistance reset bit, the column RC is high, but the column continues to rise rapidly since the final voltage (Vfinal) charging voltage is still very high compared to the column voltage because Iread×Rbit is high until the reset bit triggers into a low resistance state. As the voltage across the element 12b exceeds its threshold (if it is reset), the bit triggers into a low dV/dI state, and decays to about the same voltage as the voltage from a set bit, with a read current greater than the device 12b oum threshold current. Thereafter both the oum and ots being triggered (if not at about the same time), the actual Vfinal is reached quickly since both are in a low dynamic resistance state, so RC is low.

After both elements 12a and 12b have triggered, the bit voltage (whether set or reset) is approximately $V_{HA}+V_{HB}$+Iread×(dV/dI (device a)+dV/dI (device b)), where $V_{HA}$ and $V_{HB}$ are the holding voltages of the device 12a and element 12b, respectively. This presumes that Iread×Rset for a set bit is about the same as the Vhoum that a reset bit thresholds to. This voltage D, set by dV/dI×read current plus holding voltage of the ots, and plus holding voltage of the oum if it is reset, is achieved rapidly once both trigger since the dynamic resistance is low once both the select device 12a and memory element 12b trigger into the dV/dI region.

While the resistance is low in the dV/dI portion of the IV curve for reset memory 12b after it thresholds, the amorphous bit state is retained as shown by the memory element 12b returning to the higher resistance state after the current through memory element 12b falls below $I_H$ (so long as the current through the bit does not exceed Imelt at which current the bit starts to change from Ireset to Iset). Once triggered, the reset bit stays in a relatively low resistance like a set bit until the current is returned to less than the threshold current. This final voltage D achieved after the column line voltage stabilizes in the dV/dI portion of the IV curve of the cell elements is called the "precharge voltage" used to generate the reference voltage.

After the precharge voltage D is established and stable on the column line, the column line voltage VR can be sampled to establish a lower reference voltage (VREF). The selected column bit voltages VR and VREF are inputs to the Comparator 42.

The column current is reduced or turned off at the time $t_3$ in FIG. 4B, and the column rapidly discharges toward the memory element 12b holding voltage, since dV/dI is a relatively low resistance for both set and reset bits until, for that logic case, the reset bit unthresholds. Read current may be adjusted so that Iread×Rset is about equal to Vhoum for device 12b. Below $V_H$ for the set bit case, the resulting voltage across a set bit continues to decay rapidly (region E in FIG. 4A). Thus for a set bit, after decreasing the read current, the column voltage decays rapidly from its starting precharge voltage to nearly zero across the memory element 12b with the column at a voltage equal to Vrow driver+select element 12a V. The voltage stays at Vhots if Iread remains greater than Ithots, or may decay further below Vhots for less current, but very slowly since the ots has high resistance as it unthresholds.

In contrast for a reset bit, the column line stops discharging rapidly once the device 12a holding voltage and current is reached and it untriggers into a high resistance state. Further voltage decay thereafter is at a very slow rate, such as microseconds (region F in FIG. 4A).

Thus for both states, the initial voltage decay rate (dV/dt) (region E) is set by the resistance of the dV/dI portion of the IV curve until voltage across memory element 12b is less than $V_{HB}$. Then the decay rate (region F) changes to a rate set by the resistance of the set bit below the holding voltage, often somewhat slower even for a set bit because the set resistance is moderately greater than dV/di and much slower for a reset bit once it untriggers as the current through the memory falls below $I_H$.

With VREF set between a voltage of $V_{HA}$ and a higher voltage of $V_{Hots}+V_{Houm}$, the data may be strobed, as indicated in FIG. 4D, after waiting some portion of the set bit RC time constant, where R is the set bit resistance and C is column capacitance. Preferably, this time should be short enough so the reset bit case has not significantly discharged the column line below its Vh voltage, and the set bit case has discharged the column close to Vhots so that 90% of the voltage difference from the voltage at T2-Vhots has decayed.

In some embodiments, using this approach may reduce the effect of variation in device 12a holding voltage, bit to bit, by first sampling the column voltage before the column current is turned off for final comparison to the resulting sampled voltage after the column current is turned off or substantially reduced to a current less than $I_{Houm}$, but perhaps greater than $I_{Hots}$.

The reference for comparison to the resulting bit voltages is first referenced using the voltage of the bit being read, which is then subtracted when the later comparison is made, reducing cell to cell variation. Accordingly, voltage margins may be improved in some embodiments. Further, the precharge voltage may be established rapidly since a current greater than the threshold current is used to create the sampled voltage and its variation may be reduced or minimized since the dynamic resistance in this region of the IV curve for both the device 12a and element 12b may be a minimum.

Further reduction in read delay may be accomplished by allowing the Vthots to be greater than Vhots by more than Vthoum. Then, the delay from B to C is eliminated, so the delay from t1 to t3 is reduced.

To further improve margin, read current mirror may use an extra column resistance R in series, that may be placed to minimize area or placed on each column for even more effectiveness below the high capacitance node. The result is that the voltage VR on the column where the discharge slows for a reset bit is at a higher voltage relative to that achieved rapidly by a set bit, so that the read window is amplified in some embodiments.

The voltage across the optional resistor R may provide added read margin which can be adjusted with the size of the resistor to fit the threshold current for a given chip, using the non-volatile portion of the memory or the fuse redundancy repair circuit to adjust, along with the VREF, to improve margins. The magnitude of the resistance, as is apparent to one reasonably skilled in the art, is limited to that allowed by performance requirements to the delay increase in the RC discharge time for a set bit. More voltage margin is provided at increased R but at the expense of increased read access delay.

The memory element 12b may reasonably retain its memory cell state for a useful number of cycles even though the current drives the reset bit into the low resistance dV/dI state. However, repeated reads that threshold (trigger) the reset bit) will gradually, until the bit is reset, decrease the memory element 12b threshold voltage and stored resistance for currents below I. Once the resistance degrades too much for adequate read voltage margin, the reset bit must be re-written (refreshed) to avoid a read disturb. Refresh is accomplished by first reading a bit, and those in the reset (high resistance state can then be rewritten at the end of the read cycle using the faster reset cycle (extending the read cycle time accordingly).

Limiting the current and use of low capacitance loads may assist data retention and reduce bit rewriting frequency, extending endurance and reducing overhead time spent rewriting during a read. Also, cycling the bit, including with a few read cycle may remove the threshold related snapback. If this is done fifteen cycles during the write cycle and the bit verified, better data retention can be achieved. Further, the bits can be read on power down or power up to restore those degraded by read cycles. Alternatively, the entire block of memory can be refreshed periodically, such as every second, depending on the number of worst-case read cycles of a single bit. Alternately, since the write of a reset bit is relatively fast, each time a bit is read and found to be reset, the bit may be rewritten during the read cycle—retaining the good read access delay but possibly increasing read cycle time. Repeatedly rewriting a reset bit will adversely affect endurance so normal block reallocation techniques used for flash may be applied to repeated reads or writes of a given bit.

Using the techniques described herein, margins may be improved by avoiding the reduction in read window margin due to variation in device 12a hold voltage. This may improve yield and field reliability in some embodiments.

A voltage reflective of cell select and memory hold voltages is first generated for sample/hold with the column read current to create a reference voltage, and then the read current is turned off or reduced for comparison to the sampled reference voltage to improve margins by subtracting the hold voltage which may vary bit to bit, so the resulting comparison relates more to the memory resistance more reflective of cell state. In some embodiments, by using the dV/dI region D in FIG. 4A to set the reference voltage, holding voltage variation effects on read margins may be reduced and read performance improved by only using the memory in a low impedance mode.

Figure 5A:
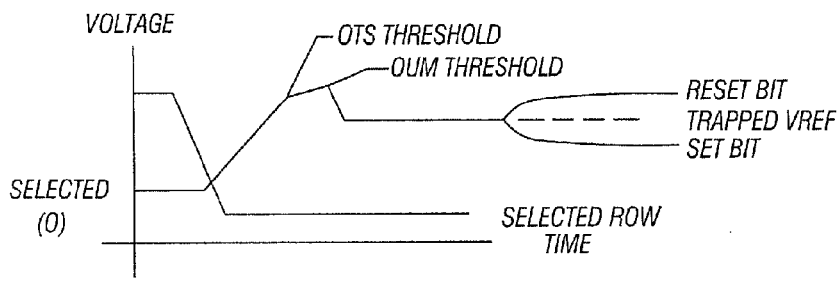
FIG. 5 includes read timing diagrams.

Referring to FIG. 5A, a read cycle is shown for both set and reset bits. As a column and row are selected, the column voltage increases over time until the device 12a thresholds (as indicated) and the device 12b thresholds (as indicated). Then the voltage drops and remains steady, such as in the period before Trap Vref in FIG. 5C (before Latch goes high). After the reference voltage is trapped (FIG. 5C) and the column current is reduced (FIG. 5B) to less than Ihoum, a reset bit voltage increases towards Vthoum+Vhots, while a set bit decreases relative to a reference voltage $V_{REF}$ towards Vhots. The sensed voltages Can be compared to the reference voltage to determine whether the bit is either set or reset.

Figure 5B:
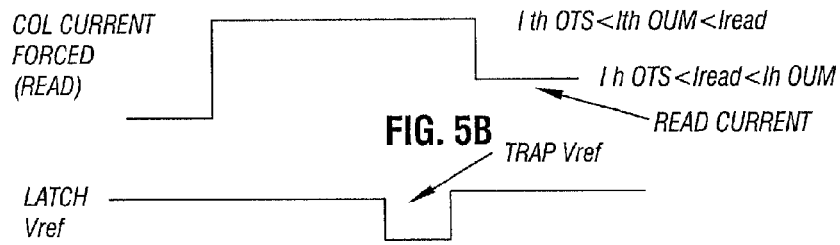

Referring to FIG. 5B, a column current is forced on the column during a read cycle. That column current ramps up initially to a first level and then ramps down to an intermediate level. The first level is such that the read current is greater than the threshold current of the device 12b and that current is greater than the threshold current of the device 12a. The second read current level is less than the holding current of the device 12b, but greater than the holding current of the device 12a. Preferably, I read should also be less than the threshold current of oum device 12b. To further increase the read voltage, the current may be first lowered to be less than Ihoum and then increased, while assuring still less than Ithoum.

Figure 5C:
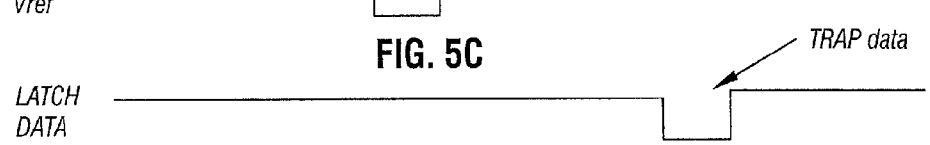

Referring to FIG. 5C, the latching of the reference voltage VREF is illustrated. In response to a latch pulse, the reference voltage may be trapped for comparison to the sensed bit voltage.

Figure 5D:
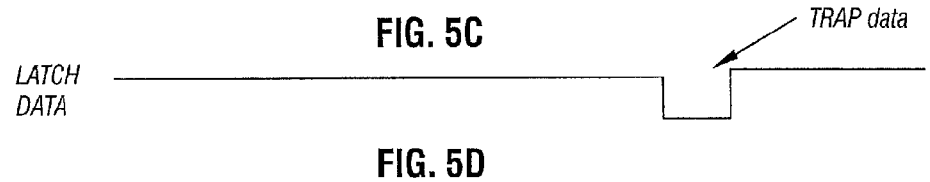

Next, referring to FIG. 5D, a pulse is utilized to latch out the sensed data. In other words, in response to the trapped data pulse as indicated, the determined bit state may be latched out.

Figure 5E:

Referring to FIG. 5E, a pulse may be provided to make a margin measurement if needed. Finally, in FIG. 6F, if the measured margin is insufficient, another write current pulse may be provided. In such case, the process may be repeated to read the bit again, hopefully with better margin the next time.

Regardless of the read current, shown in FIG. 58, the snapback voltage (FIG. 2A) of the device 12a may be greater than the threshold voltage (FIG. 2B) of the device 12b. When reading the bit, the bit will be thresholded if it is reset. Then, the read voltage (FIG. 5A) across the cell 12 is the holding voltage of the device 12a (FIG. 2A) plus the holding voltage of the device 12b (FIG. 28) plus $R_{DYN}I_{READ}$ where $R_{DYN}$ is dV/dI(OUM) (FIG. 2B)+dV/dI(OTS) (FIG. 2A).

However, if the bit is set, the voltage across the cell 12 is the holding voltage of the device 12a plus the set resistance times the read current, where the read current is adjusted to be sure this voltage is at least 200 millivolts less than the reset bit voltage. Then, the bit can be refreshed by writing to the state of the bit that is read, either each cycle or after checking margin to see if the write cycle is needed. That is, the resistance of a set bit can be measured to insure that it is less than a predetermined maximum resistance for a set bit. The reset bit resistance may be measured after reading to insure that it is more than a minimum predetermined reset resistance.

Alternatively, to improve margin, the reading of the bit can be done after the transient current on the device 12b falls below the holding current of that device, so that a reset state device 12b is untriggered. The device 12a would still be triggered because the applied forced read current exceeds its holding voltage. Then, the resistance of the selected bit may be measured to be sure that it is still greater than the minimum reset resistance. Signal of a reset bit can be increased by increasing the current after it unthresholds, such as to less than Ith(oum).

Allowing the reset bit to untrigger, may result in more voltage difference between the set and reset bits. As the read cycle proceeds, the voltage across device 12a exceeds its threshold voltage so that the device 12a snaps back to its holding voltage (FIG. 2A). This snapback forces more than its threshold voltage across the device 12b, if it is reset, so the voltage across device 12b triggers to its holding voltage plus the column current times dV/dI. Then, the current decays as the transients die out and the current falls to the read current (FIG. 5B). If the read current is less than the holding voltage of the device 12b, then the voltage falls along dV/dI (FIG. 2B) until the device 12b untriggers. Then, the voltage across the device 12b may increase towards its threshold voltage, but does not exceed its threshold voltage if the forced current is less than the threshold current of the device 12b.

In some embodiments, a single threshold device 12a may be used in series with a memory element 12b to simplify the manufacturing process and allow the use of a lower leakage, thicker select device 12a in the cell 12. The memory cell 12 may include a select device 12a in series with a memory element 12b, where the select device 12a is allowed to be thicker and have a greater snapback voltage than the threshold voltage of the memory element 12b. As a result in some embodiments, the stack of the devices 12a and 12b may be thinner since a single select device is utilized. By using a single thicker device with more snapback, leakage may also be reduced to deslected rows since thicker ots devices with more snapback tend to less leakage.

On each read cycle, the memory element 12b is read. If the bit is thresholded, it can be read while thresholded by being sure the voltage across a reset bit is adequately more than the holding voltage of the memory element 12b. Or, the memory element 12b may be triggered when the select device 12a snaps back. Then, the read current can be lowered to be above the holding current of the select device 12a but less than the holding current of the memory element 12b.

When the current in the memory element 12b falls below the holding current of that device, the reset element 12b untriggers.

After triggering device 12b by forcing current greater than Ith, then forcing a read current less than the holding current of the memory element 12b and then increasing the current to be less than Ithoum, but greater than the holding current of the memory element 12a, can force more voltage than the memory element's holding voltage and less than the memory element's threshold voltage (after transient current caused by triggering the device 12a decays to become the read current), allowing more read voltage and margin compared to the read voltage generated across a triggered reset bit.

Figure 5F:

After reading, the resistance of the selected bit may be checked and the bit rewritten or refreshed if necessary (FIGS. 5E and 5F). This may also be done on each cycle or periodically, such as at power-up.

Figure 6:
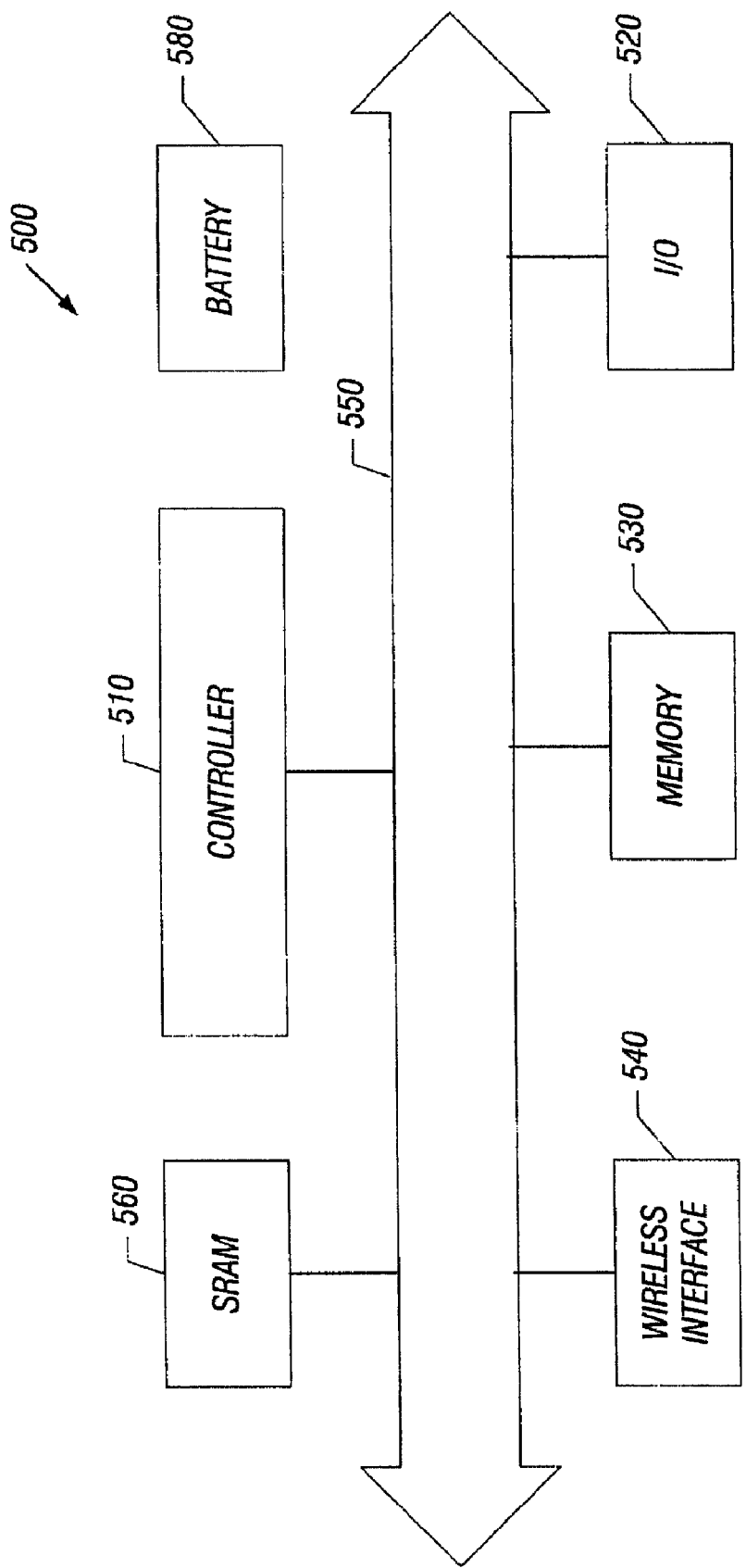
FIG. 6 is a system depiction according to one embodiment of the present invention.

Turning to FIG. 6, a portion of a system 500 in accordance with an embodiment of the present invention is described. System 500 may be used in wireless devices such as, for example, a personal digital assistant (PDA), a laptop or portable computer with wireless capability, a web tablet, a wireless telephone, a pager, an instant messaging device, a digital music player, a digital camera, or other devices that may be adapted to transmit and/or receive information wirelessly. System 500 may be used in any of the following systems: a wireless local area network (WLAN) system, a wireless personal area network (WPAN) system, or a cellular network, although the scope of the present invention is not limited in this respect.

System 500 may include a controller 510, an input/output (I/O) device 520 (e.g. a keypad, display), a memory 530, a wireless interface 540, and a static random access memory (SRAM) 560 and coupled to each other via a bus 550. A battery 580 may supply power to the system 500 in one embodiment. It should be noted that the scope of the present invention is not limited to embodiments having any or all of these components.

Controller 510 may comprise, for example, one or more microprocessors, digital signal processors, micro-controllers, or the like. Memory 530 may be used to store messages transmitted to or by system 500. Memory 530 may also optionally be used to store instructions that are executed by controller 510 during the operation of system 500, and may be used to store user data. The instructions may be stored as digital information and the user data, disclosed herein, may be stored in one section of the memory as digital data and in another section as analog memory. As another example, a given section at one time may be labeled as such and store digital information, and then later may be relabeled and reconfigured to store analog information. Memory 530 may be provided by one or more different types of memory. For example, memory 530 may comprise a volatile memory (any type of random access memory), a non-volatile memory such as a flash memory, and/or memory 10 illustrated in FIG. 1.

The I/O device 520 may be used to generate a message. The system 500 may use the wireless interface 540 to transmit and receive messages to and from a wireless communication network with a radio frequency (RF) signal. Examples of the wireless interface 540 may include an antenna, or a wireless transceiver, such as a dipole antenna, although the scope of the present invention is not limited in this respect. Also, the I/O device 520 may deliver a voltage reflecting what is stored as either a digital output (if digital information was stored), or it may be analog information (if analog information was stored).

While an example in a wireless application is provided above, embodiments of the present invention may also be used in non-wireless applications as well.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A system comprising:
   a processor; and
   a memory including phase change memory cells connected to a bit line and a sense amplifier to sense a triggered cell, said memory including a reference generator connected to said bit line, said reference generator to alter a level from said bit line.

2. A system of claim 1 wherein said cells include a non-programmable chalcogenide threshold device.

3. The system of claim 1 wherein said memory includes address lines coupled to said cells and a reference generator coupled to an address line including a cell to be sensed.

4. The system of claim 3 wherein said reference generator to store a reference level on said line.

5. The system of claim 4 wherein said reference generator to reduce the level of a signal from said line.

6. The system of claim 5 wherein the sense amplifier to compare said reduced level signal to the reference level.

7. The system of claim 5 wherein the sense amplifier to compare the signal to the reference after the level of the signal is increased from the reduced level.

\* \* \* \* \*